(12) United States Patent
Helmstetter et al.

(10) Patent No.: US 7,053,322 B2
(45) Date of Patent: May 30, 2006

(54) GAS BAG MODULE

(75) Inventors: Matthias Helmstetter, Aschaffenburg (DE); Guido Hirzmann, Sailauf (DE); Andreas Heil, Aschaffenburg (DE); Michael Schneider, Sulzbach (DE)

(73) Assignee: TRW Automotive Safety Systems GmbH, Aschaffenburg (DE)

( * ) Notice: Subject to any disclaimer, the term of this patent is extended or adjusted under 35 U.S.C. 154(b) by 0 days.

(21) Appl. No.: 11/192,457

(22) Filed: Jul. 28, 2005

(65) Prior Publication Data
US 2006/0027448 A1   Feb. 9, 2006

(30) Foreign Application Priority Data
Aug. 3, 2004   (DE)  .................. 10 2004 037 462
Aug. 18, 2004  (DE)  .................. 20 2004 012 964 U

(51) Int. Cl.
*H01H 9/00*   (2006.01)

(52) U.S. Cl. .................. 200/61.54; 200/61.55; 200/61.56

(58) Field of Classification Search .. 200/61.54–61.57; 280/728.2, 731
See application file for complete search history.

(56) References Cited

U.S. PATENT DOCUMENTS

| | | | | |
|---|---|---|---|---|
| 4,733,030 A * | 3/1988 | Erdelitsch et al. | ....... | 200/61.54 |
| 5,459,294 A * | 10/1995 | Danielson | ................ | 200/61.54 |
| 6,147,315 A * | 11/2000 | Rudolph et al. | ......... | 200/61.54 |
| 6,639,160 B1 * | 10/2003 | Ibe et al. | ................. | 200/61.54 |
| 6,688,637 B1 * | 2/2004 | Igawa et al. | ............ | 280/728.2 |
| 6,849,816 B1 * | 2/2005 | Rumpf | ................... | 200/61.54 |

FOREIGN PATENT DOCUMENTS

| | | |
|---|---|---|
| EP | 0613157 | 8/1994 |
| WO | 2004/049763 | 6/2004 |

* cited by examiner

*Primary Examiner*—Michael A. Friedhofer
(74) *Attorney, Agent, or Firm*—Tarolli, Sundheim, Covell & Tummino LLP

(57) ABSTRACT

A Gas bag module for use in a vehicle occupant restraint device has a plastic generator support. On the generator support a printed circuit is formed by metal deposition. For activating an electrical function element, the printed circuit cooperates with a switching element that is arranged on a section of the generator support.

22 Claims, 3 Drawing Sheets

GAS BAG MODULE

TECHNICAL FIELD

The present invention relates to a gas bag module for use in a vehicle occupant restraint device having a plastic generator support.

BACKGROUND OF THE INVENTION

Gas bag modules are a component part of vehicle occupant restraint systems and can be arranged in the steering wheel, for example, for the protection of the driver. However, due to the space requirements for the gas bag module, problems arise with respect to the spatial arrangement of the cabling and contacts for activating electrical function elements such as an electrical horn. In addition, operating elements and switches for controlling the vehicle functions need to be easily accessible for the driver on or in the steering wheel, and if possible they should be configured as multifunctional elements. However, in this way the number of cables for connecting the operating elements to the vehicle electronics grows, along with the space requirements.

In accordance with the so-called "floating horn" principle, gas bag modules are arranged on the steering wheel in such a way that the horn signal can be activated by pressure exerted by the driver on the gas bag module. In this context, one contact is arranged on the gas bag module and one on the steering wheel, the gas bag module being connected to the steering wheel by elastic distancing elements. Thus the contacts can be closed when pressure is exerted on the gas bag module by a motion of the gas bag module towards the steering wheel, and in this way the horn or other electrical function element can be activated.

From DE 199 27 032 A1, an assembly is known that operates in accordance with this principle and that has a steering wheel and a gas bag module. The gas bag module includes a plastic generator support, which is manufactured in an injection molding process and into which a wire element is injected. The wire element has hoop-shaped segments, which are provided with plastic sleeves for electrical insulation and which engage in latching hooks that are arranged on the steering wheel for the purpose of attaching the gas bag module. The generator support also has one or more recesses, in which the wire element is accessible and is not electrically insulated. In these recesses, the wire element constitutes a contact that activates the horn and that cooperates with an electrically conductive opposite contact on the steering wheel. When the contact and the opposite contact are closed through pressure being exerted on the gas bag module in the direction of the steering wheel, the electrical horn is activated.

SUMMARY OF THE INVENTION

It is therefore an object of the present invention to provide a gas bag module that is simply designed and that permits the integration of multifunctional elements and switches without requiring additional components and cable leads. According to the invention, the gas bag module for use in a vehicle occupant restraint device comprises a plastic generator support. On the generator support a printed circuit formed by metal deposition is provided. For activating an electrical function element, the printed circuit cooperates with a switching element that is arranged on a section of the generator support.

The generator support of the gas bag module according to the present invention can therefore be configured in a simple manner as a three-dimensional, injection-molded circuit substrate or molded interconnected device. Thus a multiplicity of familiar and cost-effective manufacturing methods are available. The conducting tracks of the printed circuit formed on the generator support take on the function of the conventional cabling. Therefore, on the one hand, weight can be reduced and, on the other hand, installation space for the usual cable leads and plug connectors is saved. In order that the printed circuit that is applied to the generator support be connected to the vehicle electronics, only a single plug-in circuit board is required, as a result of which the placement of cables in the steering wheel is made significantly simpler. Various switching elements for activating electrical function elements via the vehicle electronics can be connected to the printed circuit on the generator support, the switching elements being comfortably accessible to the driver as a result of the arrangement of the switching elements in the steering wheel.

Finally, the present invention makes it possible to additionally simplify the design of the multifunctional switches that are integrated in the steering wheel, because the generator support that must be there in any case can be used as a base for the switching elements. In this way, a simple and cost-effective design of a multifunctional switch that is integrated in the steering wheel is achieved.

A separate panel can be used as a cover for the multifunctional switch or for the switching element that is arranged on the section of the generator support that has the printed circuit. However, it is especially advantageous if at least one opening or through hole is introduced in the cover of the gas bag module, in which an actuating section of the switching element is accommodated. Then the cover of the gas bag module at the same time constitutes the cover of the multifunctional switch, advantageously making a further component unnecessary. In a familiar manner, the switching element itself can be configured as a silicone switching mat. Furthermore, the switching element can include a conventional circuit board that is connected to the printed circuit.

For activating an electrical function element, for example an electrical horn, the switching element is preferably brought into contact with a contact section on the printed circuit. The contact section can advantageously be formed by two sections of the printed circuit that are adjacent to each other and electrically insulated from each other and that are bridged by the switching element for activating the electrical function element, thus forming a closed electrical circuit.

In one variant of the gas bag module according to the present invention, a printed circuit formed by metal deposition is provided on the plastic generator support, the printed circuit for activating an electrical function element, for example an electrical horn, cooperating with a switching element that is arranged at a predetermined distance from a contact section of the printed circuit. In this context, it is especially preferable, in accordance with the "floating horn" principle, if the gas bag module has elastic distancing elements, which maintain a defined distance between the section of the printed circuit and the switching element, which is formed, in a simple manner, as an opposite contact. As a result of a pressure being exerted on the cover of the gas bag module, the contact section, which is preferably formed by two conducting tracks that are adjacent to each other and electrically insulated from each other, is bridged by the opposite contact, which is configured, for example, as a metallized surface, and the circuit is closed, so that the electrical function element, i.e. the horn, is activated.

The printed circuit and therefore the various multifunctional switches that are connected to the printed circuit can be connected to the vehicle electronics via a simple, soldered plug connection. In this way, the cabling of the individual switching elements to the vehicle electronics is significantly simplified.

The generator support can be manufactured as a so-called "MID" component, i.e., a molded interconnected device or an injection-molded circuit substrate, in accordance with various methods. Preferably, the generator support is produced in a one-component injection molding process from a thermoplastic plastic matrix, which has a metal complex that is embedded in the plastic matrix. The thermoplastic plastic matrix can be more particularly selected from the group consisting of polyamide, polyethylene terephthalate, polybutylene terephthalate, acrylonitrile butadiene styrene, polypropylene, polycarbonate, and polyether imide. The generator support that is produced in this way in an injection-molding process is then pretreated in a first step through patterned irradiation with a laser. In a predetermined area, the laser treatment generates a surface roughness and therewith undercuts for the cramping of the metal layer to be deposited later. The laser treatment also leads to a decomposition of the metal complex embedded in the plastic matrix while producing metallizable nuclei or seeds. The generator support that is pretreated in this way is then in a familiar manner subjected to an electroless plating. For this purpose, the generator support is dipped into a bath of a metal salt solution, for example, a nickel or copper salt, and a reducing agent. In this manner, on the sections of the generator support that have been pretreated by the laser patterning, a conductive metal layer is formed, whereas the untreated sections of the generator support surface remain free of metal and therefore electrically insulating. The metal layer that is so formed can then be reinforced by an electroplating process in a galvanic cell so as to produce the printed circuit. Just as in the case of manufacturing conventional printed circuit boards, it is also possible using this method to form metallized through holes in the printed circuit on the generator support.

In place of the method of direct laser patterning described here, it is also possible to use other methods for generating patterned surfaces, such as a chemical etching or plasma etching. Finally, conventional silk-screen or tampon printing methods for manufacturing printed circuits can also be used. The generator support can then be produced as a one- or two-component part using any desired injection molding process.

DETAILED DESCRIPTION OF PREFERRED EMBODIMENTS

Figure 1:
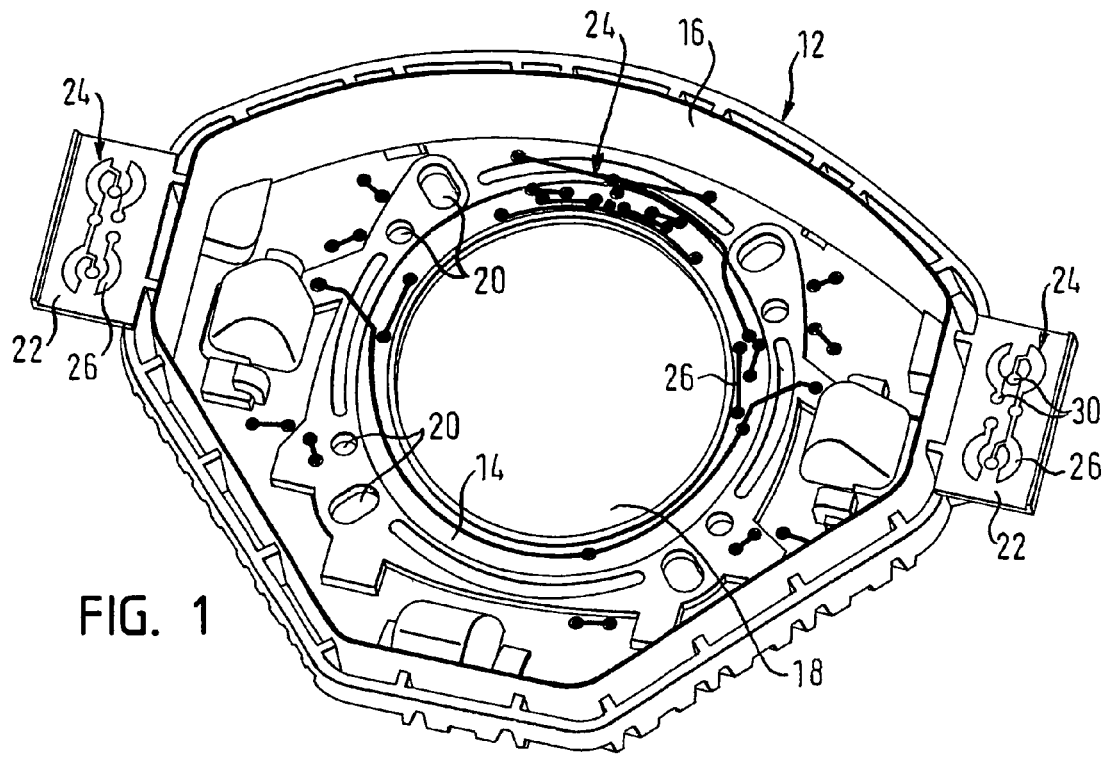
FIG. 1 depicts a top view of a generator support of the gas bag module according to the present invention.

FIG. 1 depicts generator support 12 of a gas bag module (not shown here) which is designed for installation in the steering wheel of a motor vehicle. Generator support 12 is made of plastic in an injection molding process. It has a generally pot-shaped design, having a base 14 and a circumferential side wall 16 that proceeds from base 14. Base 14 has a central opening 18 for accommodating a gas generator (not shown). In addition, further openings 20 are introduced in the base, serving, for example, to attach the gas generator to generator support 12.

On two opposite positions of side wall 16, a respective plate-shaped section 22 is integrally formed, projecting outwardly. On base 14, a printed circuit 24 having conducting tracks 26 is applied by metal deposition, the printed circuit extending as far as to plate-shaped section 22.

Figure 2:
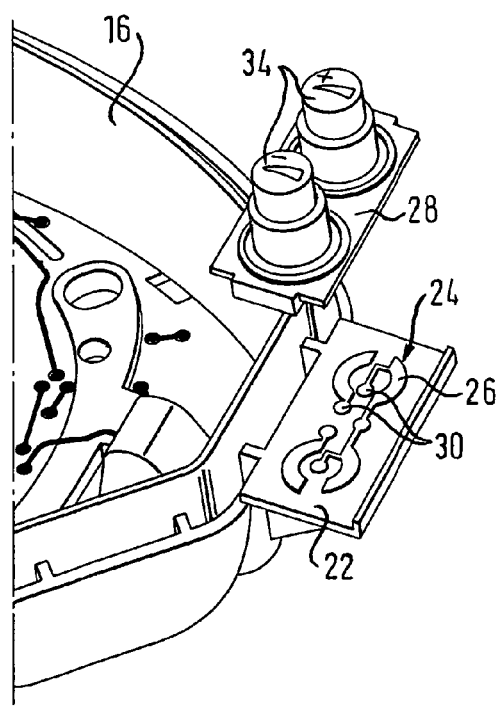
FIG. 2 depicts a detail view of the generator support from FIG. 1 with accompanying switching element.

As is depicted in FIG. 2 in a detail view, plate-shaped section 22 having conducting tracks 26 of printed circuit 24, applied thereon, functions as the base for a switching element 28, which is preferably configured as a silicone switching mat having actuating sections 34 that are positioned thereon. After switching element 28 is placed onto plate-shaped section 22, it cooperates with conducting tracks 26 of printed circuit 24 on section 22 for activating an electrical function element (not shown here). In particular, conducting tracks 26 can include contact sections 30 that are adjacent to each other and electrically insulated from each other and that can be bridged for activating the electrical function element through pressure being applied to actuating sections 34 of switching element 28.

Figure 3:
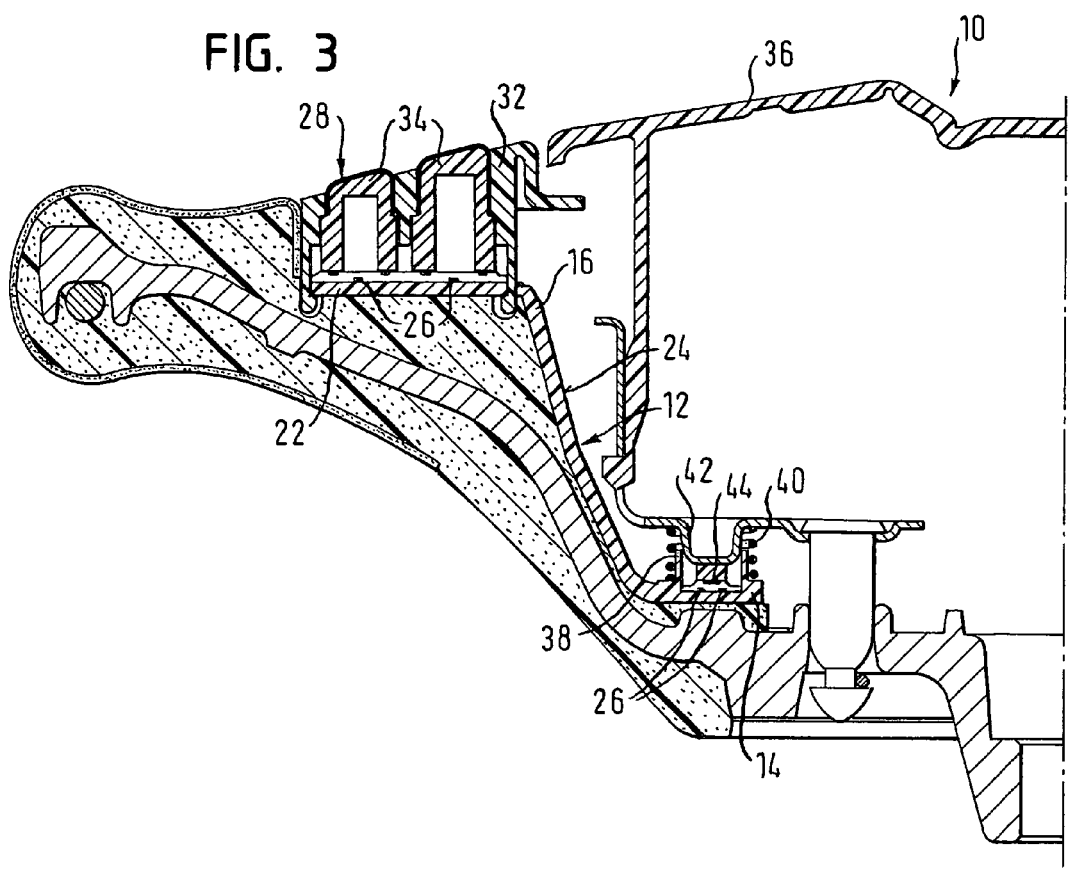
FIG. 3 depicts a sectional view of an embodiment of the gas bag module according to the present invention.

In the embodiment depicted in FIG. 3, gas bag module 10 includes pot-shaped generator support 12 having essentially planar base 14 and circumferential side wall 16. At the free end of side wall 16, plate-shaped section 22 is integrally formed, projecting outwardly. On generator support 12 and plate-shaped section 22, printed circuit 24 having conducting tracks 26 is formed by deposition of metal. Conducting tracks 26 cooperate with switching element 28, which is placed on plate-shaped section 22. Switching element 28 is fixed in position on plate-shaped section 22 by a panel 32, which is clipped onto switching element 28. Actuating sections 34 of switching element 28 are quite accessible to the driver by corresponding openings in the panel 32. Switching element 28, panel 32, and plate-shaped section 22 of generator support 12 therefore constitute a simply designed multifunctional switch that is easily accessible to the driver through its being integrated in the steering wheel.

In addition, gas bag module 10 includes a cover 36 that is elastically connected to generator support 12. For this purpose, base 14 of generator support 12 has an essentially tubular extension piece 38, which extends inward into gas bag module 10 and onto which a spiral spring 40 is placed. At its opposite end, spiral spring 40 encompasses a cup-shaped extension 42 in the base of gas bag module 10. In this manner, spiral spring 40, as an elastic distancing element, defines a predetermined distance between base 14 and cup-shaped extension 42.

In the area of tubular extension piece 38, contact sections 30 of printed circuit 24, which are adjacent to each other and electrically insulated from each other, are formed on base 14. Situated opposite contact sections 30 is cup-shaped extension 42, which functions as a switching element and can either be made of metal or have a metallized contact surface 44. This contact surface 44 constitutes an opposite contact to contact sections 30 of printed circuit 24. Through pressure applied to cover 36 in the direction of the steering wheel, spiral spring 40 is compressed and metallized contact surface 44 comes into electrical contact with conducting tracks 26. The latter are bridged, a circuit is closed, and thus the electrical function element, for example a horn, is activated.

Figure 4:
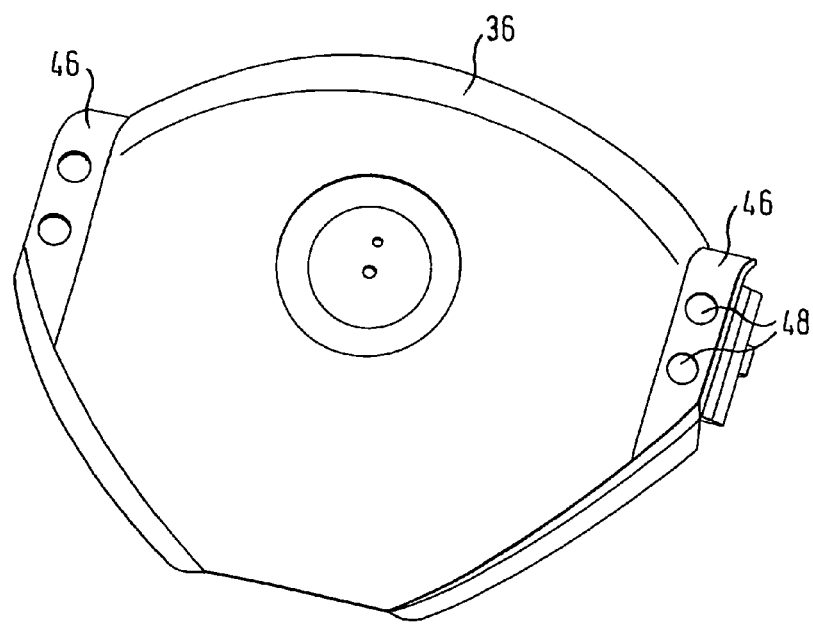
FIG. 4 depicts a cover in accordance with one embodiment of the gas bag module according to the present invention.

In FIG. 4, the cover 36 of a gas bag module is shown, in which edge sections 46 are provided with openings 48. These openings 48 can accommodate actuating sections 34 of switching element 28, which is depicted in FIG. 2. Cover 36 therefore also replaces panel 32 of the embodiment depicted in FIG. 3. In this way, a further reduction in the switching components can be achieved.

Figure 5:
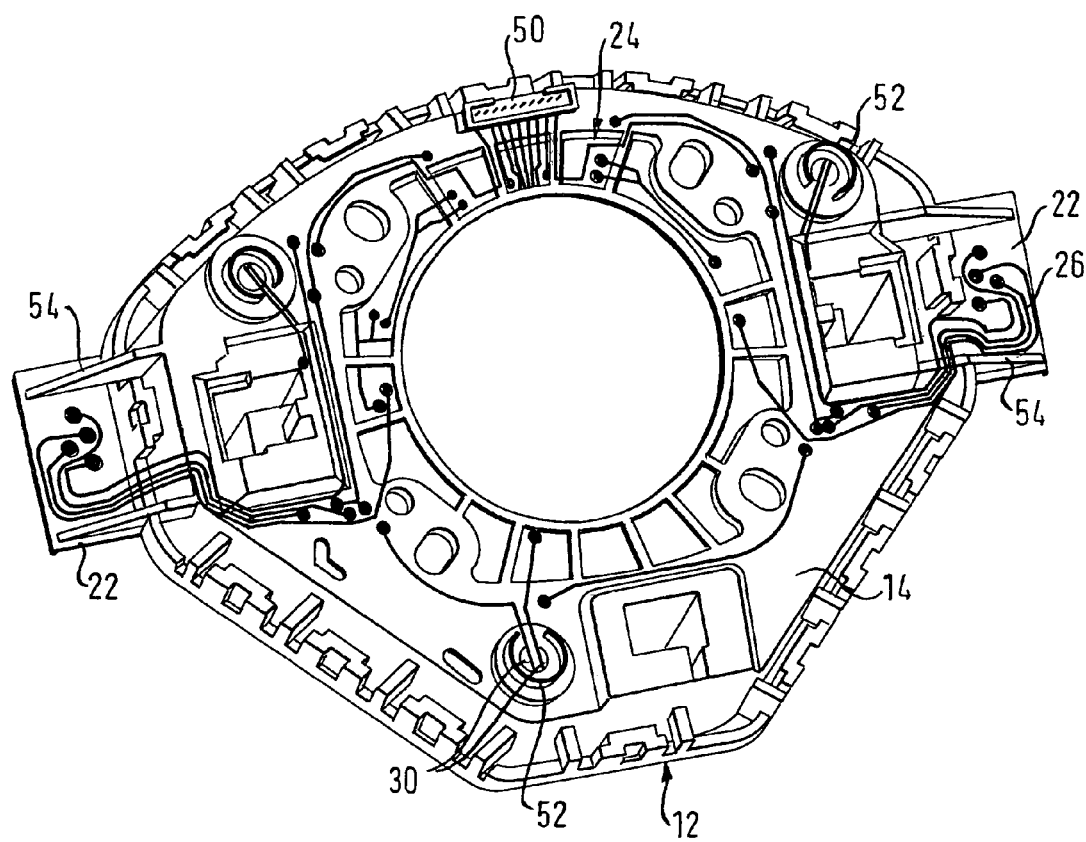
FIG. 5 depicts a top view of the lower side of the generator support from FIG. 1.

Finally, in FIG. 5, it is shown that the lower side of generator support 12, as described above, can also be provided with a printed circuit 24. Printed circuit 24 is attached to a plug connector 50, which can provide a connection to the vehicle electronics in a simple manner. Printed circuit 24 takes on the task of cable leads, for example to horn contacts 52, the cable leads including contact sections 30 of conducting tracks 26 that are adjacent to each other and electrically insulated from each other. Furthermore, conducting tracks 26 extend toward plate-shaped sections 22, where they cooperate with switching element(s) 28 (FIG. 2). Plate-shaped sections 22 can be further reinforced mechanically using bars or ribs 54 that are arranged on their lower side.

The invention claimed is:

1. A gas bag module (10) for use in a vehicle occupant restraint device comprising a plastic generator support (12) and a switching element (28) that is arranged on a section (22) of the generator support (12), wherein on the generator support (12) a printed circuit (24) formed by metal deposition is provided, and wherein the printed circuit (24) cooperates with said switching element for activating an electrical function element.

2. The gas bag module of claim 1, wherein the switching element (28) is electrically connected to the printed circuit (24).

3. The gas bag module of claim 1, wherein the switching element (28) includes an actuating section (34), and the gas bag module (10) includes a cover (36) that is connected to the generator support (12), the cover (36) having at least one opening (38), in which the actuating section (34) is accommodated.

4. The gas bag module of claim 1, wherein the switching element (28) is provided with a separate panel (32).

5. The gas bag module of claim 1, wherein the switching element (28) is configured as a silicone switching mat.

6. The gas bag module of claim 1, wherein the switching element (28) includes a circuit board that is connected to the printed circuit (24).

7. The gas bag module of claim 1, wherein the printed circuit (24) has a contact section (30), and the switching element (28) is brought into contact with the contact section (30).

8. The gas bag module of claim 7, wherein the contact section (30) is formed by two sections of the printed circuit (24) that are adjacent to each other and electrically insulated from each other and that can be bridged by the switching element (28) for activating the electrical function element.

9. The gas bag module of claim 1, wherein the electrical function element is a horn.

10. The gas bag module of claim 1, wherein the printed circuit (24) is connected to a plug connection (50) for connecting the printed circuit (24) to a vehicle electronics.

11. The gas bag module of claim 1, wherein the generator support (12) comprises a thermoplastic plastic matrix having a metal complex embedded in the plastic matrix.

12. The gas bag module of claim 11, wherein the thermoplastic plastic matrix is selected from the group consisting of polyamide, polyethylene terephthalate, polybutylene terephthalate, acrylonitrile butadiene styrene, polypropylene, polycarbonate, and polyether imide.

13. The gas bag module of claim 1, wherein the printed circuit (24) has metallized through holes.

14. The gas bag module claim 1, wherein the printed circuit (24) is generated by laser patterning of a surface of the generator support (12) and metal deposition on the patterned surface.

15. The gas bag module of claim 1, wherein the metal deposition includes at least one of an electroless plating or an electroplating.

16. A gas bag module (10) for use in a vehicle occupant restraint device comprising a plastic generator support (12), and a printed circuit (24) formed by metal deposition on the generator support (12) and having a contact section (30) and further comprising a switching element (44) that is arranged at a predetermined distance from the contact section (30), wherein the printed circuit (24) cooperates with said switching element (44) for activating an electrical function element.

17. The gas bag module of claim 16, wherein the switching element (44) forms an opposite contact for the contact section (30).

18. The gas bag module of claim 16, wherein the contact section (30) is formed by first and second sections of the printed circuit (24) that are adjacent to each other and electrically insulated from each other and that are adapted to be bridged by the switching element (44) for activating the electrical function element.

19. A method of manufacturing a gas bag module (10) for use in an occupant restraint system in vehicles, the gas bag module (10) comprising a plastic generator support (12) and a switching element (28) arranged on a section of the generator support (12), the method comprising the steps of:

Pretreating a surface of the plastic generator support in a predetermined area to generate a surface roughness, and Electrolytically depositing metal on said pretreated surface to form a printed circuit, the printed circuit cooperating with said switching element to activate an electrical function element.

20. The method of claim 19, characterized in that the generator support is made from a thermoplastic resin by injection molding, the thermoplastic resin including a metal complex embedded in said resin.

21. The method of claim 20, wherein the pretreatment step includes patterning irradiation of the surface of the generator support by means of a laser.

22. The method of claim 19, wherein the pretreating step includes chemical etching or plasma etching of the surface, and wherein the pretreated surface is subjected to an electroless metal deposition prior to said electrolytical deposition of metal.

* * * * *